(12) United States Patent
Hauck

(10) Patent No.: US 8,744,037 B2
(45) Date of Patent: Jun. 3, 2014

(54) DIVIDER, METHOD FOR PROVIDING AN OUTPUT SIGNAL AND EDGE TRACKER

(75) Inventor: Oliver Hauck, Grasbrunn (DE)

(73) Assignee: Intel Mobil Communications GmbH, Neubiberg (DE)

( * ) Notice: Subject to any disclaimer, the term of this patent is extended or adjusted under 35 U.S.C. 154(b) by 0 days.

(21) Appl. No.: 13/493,501

(22) Filed: Jun. 11, 2012

(65) Prior Publication Data

US 2013/0328594 A1    Dec. 12, 2013

(51) Int. Cl.
*H03K 21/00* (2006.01)
*H03K 23/00* (2006.01)

(52) U.S. Cl.
USPC .............................. 377/47; 327/115; 327/117

(58) Field of Classification Search
USPC ............... 327/113–115, 117, 118; 377/47, 48
See application file for complete search history.

(56) References Cited

U.S. PATENT DOCUMENTS

| | | | |
|---|---|---|---|
| 5,948,046 A * | 9/1999 | Hagberg | 708/103 |
| 7,109,762 B2 * | 9/2006 | Neurauter et al. | 327/115 |
| 7,167,685 B2 * | 1/2007 | Kakerow et al. | 455/76 |
| 7,170,965 B2 * | 1/2007 | Chien | 375/376 |
| 7,289,592 B2 * | 10/2007 | Lee | 377/47 |
| 7,800,417 B2 * | 9/2010 | Bazes | 327/117 |

OTHER PUBLICATIONS

Vaucher, et al. "A Family of Low-Power Truly Modular Programmable Dividers in Standard 0.35-_m CMOS Technology." IEEE Journal of Solid-State Circuits, vol. 35, No. 7, Jul. 2000. 7 Pages.
Krishnapura, et al. "A 5.3-GHz Programmable Divider for HiPerLAN in 0.25-_m CMOS." IEEE Journal of Solid-State Circuits, vol. 35, No. 7, Jul. 2000. 6 Pages.
Deng, et al. "The Speed-Power Trade-Off in the Design of CMOS True-Single-Phase-Clock Dividers." IEEE Journal of Solid-State Circuits, vol. 45, No. 11, Nov. 2010. 9 Pages.

* cited by examiner

*Primary Examiner* — Patrick O'Neill
(74) *Attorney, Agent, or Firm* — Eschweiler & Associates, LLC

(57) ABSTRACT

A divider for providing an output signal having an output frequency by dividing a reference frequency of a reference signal by a divider value is disclosed. The divider includes at least a first divider element configured to provide a first divider output signal having a first divider output signal frequency which is half of the reference frequency and a last divider element configured to provide a last divider output signal having a last divider output signal frequency which half of the preceding divider output signal frequency. Furthermore, the divider comprises an output signal provider for providing the output signal.

27 Claims, 11 Drawing Sheets

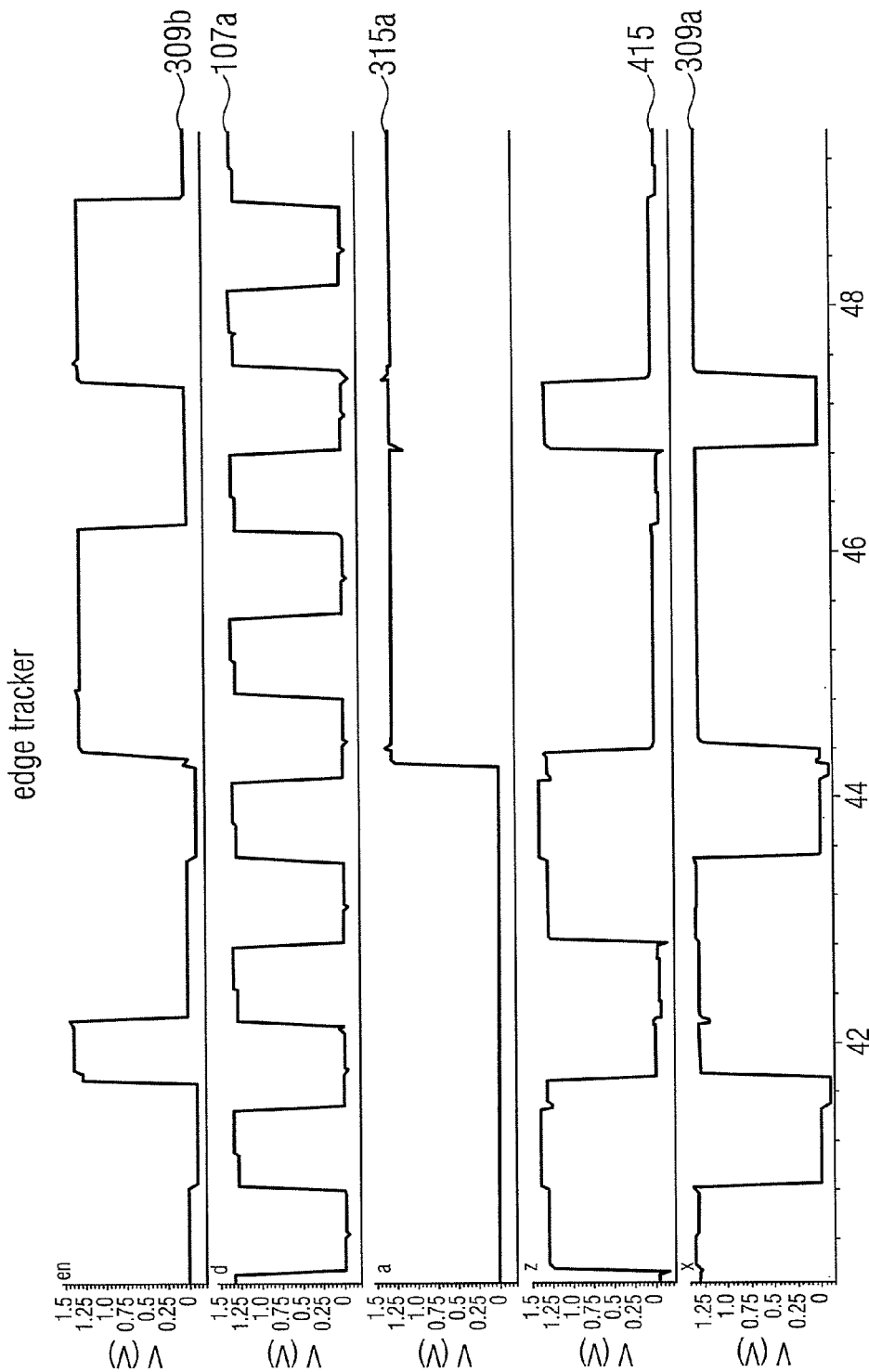

DIVIDER, METHOD FOR PROVIDING AN OUTPUT SIGNAL AND EDGE TRACKER

FIELD

Embodiments of the present invention relate to a divider for providing an output signal having an output frequency by dividing a reference frequency of a reference signal by a divider value. Further embodiments relate to a method for providing such output signals. Further embodiments relate to an edge tracker.

BACKGROUND

Multi-Modulus Dividers (MMDs) are key circuit building blocks in PLL-based frequency generation for RF transceivers. Basically, a MMD divides the frequency of its input signal by a programmable divider value. Consider an exemplary transceiver PLL incorporating three MMDs: feedback MMD, LO (Local Oscillator) MMD for receive, and TX MMD for transmit.

As MMDs have to cope with multi-GHz signals, problems arise when the maximum speed of the MMD is not sufficient or the power consumption is too high. Furthermore, the duty cycle of the MMD output signal can be important. While this is not the case for the feedback divider, the TX MMD has to deliver 50% duty cycle output. Otherwise the linearity of the output stage suffers and harmonics occur in the transmit spectrum.

SUMMARY

Embodiments of the present invention relate to a divider for providing an output signal having an output frequency by dividing a reference frequency of a reference signal by a divider value. The divider comprises a chain of divider elements. The chain of divider elements comprises at least a first divider element and a last divider element. The first divider element is configured to receive the reference signal and provide a first divider output signal having a first divider output signal frequency which is half of the reference frequency. The last divider element is configured to receive a preceding divider output signal having a preceding divider output signal frequency from a preceding divider element of the chain and provide a last divider output signal having a last divider output signal frequency which is half of the preceding divider output signal frequency. Furthermore, the divider comprises an output signal provider for providing the output signal. The output signal provider is configured to determine toggle states based on the divider value, wherein each toggle state is associated with a toggling of the output signal and comprises a first bit associated with the first divider output signal and a last bit associated with the last divider output signal, wherein the bits are indicative of certain properties of the associated divider output signals. Furthermore, the output signal provider is configured to verify that an actual property of the last divider output signal corresponds to the certain property indicated by the last bit associated with the last divider output signal. Furthermore, the output signal provider is configured to subsequently, upon this verification, further verify that the actual property of the first divider output signal corresponds to the certain property indicated by the first bit associated with the first divider output signal. Furthermore, the output signal provider is configured to subsequently, upon this further verification, toggle the output signal at a predetermined edge in the reference signal.

Further embodiments relate to a method for providing an output signal having an output frequency by dividing a reference frequency of a reference signal by a divider value.

Further embodiments of the present invention relate to an edge tracker for tracking a predefined edge in an input signal having a known start value.

BRIEF DESCRIPTION OF THE DRAWINGS

Embodiments of the present invention will be described in more detail using the accompanying Figures in which:

FIG. 3b shows a block schematic diagram of a single divider slice or divider stage how it is used in the divider shown in FIG. 3a;

FIG. 5a shows signal diagrams for DIV18 using the divider shown in FIG. 3a;

FIG. 5b shows signal diagrams for DIV17 using the divider shown in FIG. 3a;

FIG. 5c shows signal diagrams demonstrating the different possible states of the edge tracker shown in FIG. 4;

DETAILED DESCRIPTION

Before embodiments of the present invention are described in detail using the accompanying Figures, it is to be pointed out that in the Figures the same elements or functionally equal elements are provided with the same reference numbers and that a repeated description for elements with the same reference numbers is omitted. Hence, description provided for elements having the same reference numbers are mutually exchangeable.

Figure 1:
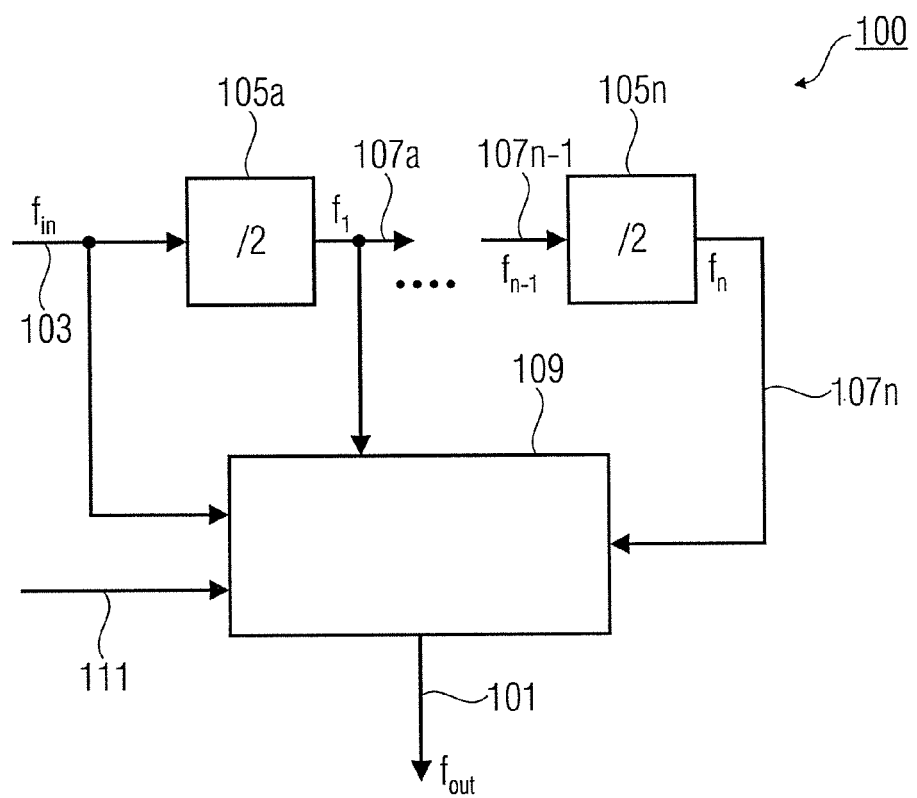
FIG. 1 shows a block schematic diagram of a divider according to an embodiment of the present invention.

FIG. 1 shows a block schematic diagram of a divider 100 according to an embodiment of the present invention. The divider 100 may be a so-called multi-modulo divider 100 (MMD 100). The divider 100 is configured to provide an output signal 101 having an output frequency $f_{out}$ by dividing a reference frequency $f_{in}$ of a reference signal 103 or input signal 103 by a divider value. The divider 100 comprises a chain of divider elements 105a to 105n. The chain of divider elements 105a to 105n comprises a first divider element 105a configured to receive a reference signal 103 and provide a first divider output signal 107a having a first divider output signal frequency $f_1$ which is half of the reference frequency $f_{in}$. Furthermore, the chain of divider elements 105a to 105n comprises a last divider element 105n (which is a last divider element in the chain of divider elements 105a to 105n). The last divider element 105n is configured to receive a preceding divider output signal 107n−1 having a preceding divider output signal frequency $f_{n-1}$ from a preceding divider element of the chain. Furthermore, the last divider element 105n is configured to provide a last divider output signal 107n having a last divider output signal frequency $f_n$ which is half of the preceding divider output signal frequency $f_{n-1}$.

In other words, the divider elements 105a to 105n may be so-called DIV2 elements, which are configured to divide an incoming signal frequency by two. The number of divider elements 105a to 105n may be arbitrary and may be dependent on the divider value 111 which should be achieved at maximum by the divider 100. In a smaller embodiment of the present invention the chain of divider elements 105a, 105n comprises two divider elements. Furthermore, the divider 100 comprises an output signal provider 109 for providing the output signal 101. The output signal provider 109 is configured to determine toggle states (or counter states of a counter formed by the divider elements 105a to 105n) based on the divider value 111, wherein each toggle state is associated with a toggling of the output signal 101. Furthermore, each toggle state comprises a first bit associated with the first divider output signal 107a and a last bit associated with the last divider output signal 107n, wherein the bits are indicative of certain properties of the associated divider output signals 107a to 107n. Furthermore the output signal provider 109 is configured to verify that an actual property of the last divider output signal 107n corresponds to the certain property indicated by the last bit (of the toggle state) associated with the last divider output signal 107n. Furthermore, the output signal provider 109 is configured to, subsequently, upon the verification that the last divider output signal 107n corresponds to the certain property indicated by the last bit, further verify that the actual property of the first divider output signal 107a corresponds to the certain property indicated by the first bit (in the toggle state) associated with the first divider output signal 107a. Furthermore, the output signal provider 109 is configured to, subsequently, upon this further (or last) verification, toggle the output signal 101 at a predetermined edge (e.g. falling edge or rising edge) in the reference signal.

The core of the MMD 100 is formed by the chain of the divider elements 105a to 105n (which are DIV2 elements as can be seen in FIG. 1). The output frequency $f_{out}$ of the output signal 101 is related to the input frequency $F_{IN}$ of the reference signal 103 by $f_{in}/f_{out}=2^n$ (wherein n is the number of divider elements 105a to 105n). The structure can be understood at the same time as an asynchronous binary counter in which the state is defined by the outputs of all the divider elements or DIV2 stages 105a to 105n. The first one may be regarded as the LSB and the last one may be regarded as the MSB. A basic idea of embodiments of the present invention is to have this structure counting continuously without any interruption or reloading to retain its energy efficiency.

In other words, the divider 100 shown in FIG. 1 is a cyclic multi-modulo divider 100 without the need for resetting the divider elements 105a to 105n. It should be pointed out that due to the asynchronous operation ¾ of the power is spent in the first two stages, independent of the total number of stages.

The state of all divider elements 105a to 105n at any given time embodies information that is needed to compute the output. The challenge is now to extract the toggle state in a clear, energy efficient way so as not to impede the high speed counter operation. It is to be pointed out that extracting the state of an asynchronous counter running at several GHz is not trivial. Simply looking at the n output bits of the DIV2 stages in parallel would not be energy efficient nor would it be possible.

Figure 2:
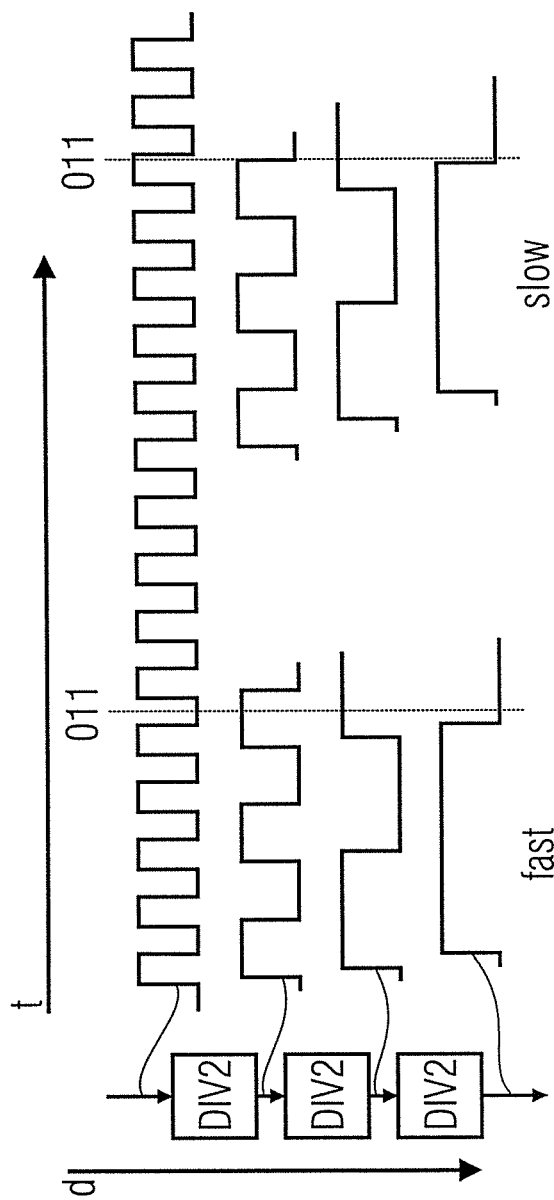
FIG. 2 shows in a diagram the timing in an asynchronous ripple counter.

FIG. 2 illustrates this problem. FIG. 2 shows the timing in an asynchronous ripple counter for a fast propagation through the DIV2 stages (left side) and a slow propagation through the DIV2 stages (right side).

By dividing down the input signal to $f_{in}/2, f_{in}/4, f_{in}/8$ . . . a CLK to Q delay of the DIV2 stages accumulates. The result is that the logical state of the counter is not coherent in time but spread over more than one input cycle. As the timing changes with the reference frequency $f_{in}$ and PVT (process voltage and temperature) a simultaneous inspection of the stages in general gives incorrect results. In the example in FIG. 2, the counter is started at 8 and counts backwards for five cycles arriving at 3. While in the fast corner (left side) the expected pattern 011 can be directly observed in the fifth cycle. This is not the case in the slow corner (right side) where the pattern 011 exists only for a very short time period and appears, to the excessive CLQ to Q delay, one input cycle too late. It turns out that the only pattern that can always be detected is the all zeros pattern. However, one would have to reload the counter every time when the zero state had been reached but reloading the counter has the following two disadvantages:

1. it complicates the elegant DIV2 stages, adding parasitics;
2. reload is inherently slow as it is a parallel operation in all stages.

Hence, embodiments of the present invention provide a new method of keeping track of the counter state while the counter can run concurrently.

It is an idea of embodiments of the present invention to turn the core of this problem into a solution, namely the distribution over time of the counter state due to stage delays. As looking at levels in parallel does not work, embodiments of the present invention (e.g., the output signal provider 109) look at transitions and/or states of the divider output signals 107a to 107n in a sequenced manner. To detect whether a certain counter state (which is a toggle state for which the output signal 101 is to be toggled) is reached, a first bit value in the bit pattern of the toggle state (logical 1 or logical 0) is associated with a rising edge or high state of the associated divider output signal 107a to 107n, a second bit value in the bit pattern (e.g., logical 0 or logical 1) is associated with a falling edge or low state of the associated divider output signal 107a to 107n. In other words, the certain property which is verified by the output signal provider 109 may be a falling edge or a rising edge or a low state or a high state in the divider output signal 107a to 107n. Starting at the MSB stage (e.g., at the last divider output signal 107n) the output signal provider 109 waits until the expected transition (either a rising or falling edge) takes place or until the expected state of the divider output signal 107n has been reached and goes up to the next stage in the chain not before this further or last verification has been completed. When the expected transition at the output of the first stage (e.g., in the first divider output signal 107a) has been reserved, the next rising edge or next falling edge of the reference signal 109 will mark the target cycle, or in other words will trigger a toggling of the output signal 101.

To summarize, the output signal provider 109 is configured to continuously determine the toggle states based on the divider value. Furthermore, the output signal provider 109 is configured to verify for each bit of the toggle state, starting with the most significant bit that the actual property of the divider output signal associated with this bit corresponds to the certain property indicated by this bit. Such property may be a falling edge or a rising edge or may be a low state or a high state of the associated divider output signal 107a to 107n. As an example, in verifying that an actual property of a given divider output signal corresponds to the certain property indicated by a given bit associated with the given divider output signal, the output signal provider 109 may wait until the actual property matches the certain property of the given divider output signal indicated by the given bit before it starts a next verification for a next divider output signal (which may be generated from a divider element directly preceding the given divider element in the chain of divider elements 105a to 105n). As an example, the output signal provider 109 may wait until a certain edge occurs in the given divider output signal or until the divider output signal takes on a certain state.

According to some embodiments of the present invention, the output signal provider 109 may be configured such that the certain property indicated by the last bit is a state (e.g., logical high or logical low) in the last divider output signal 107n. Furthermore, the output signal provider 109 may be configured such that the certain properties indicated by the other bits of the toggle state (all other bits except the last bit) is a predefined type of edge in the associated divider output signal 107a to 107n–1. As an example, the certain property indicated by the first bit may be a predefined type of edge in the first divider output signal 107a.

According to some embodiments of the present invention, the output signal provider 109 may be configured to, in verifying that the actual property of the last divider output signal 107n corresponds to the certain property indicated by the last bit of the toggle state, if the actual property of the last divider output signal 107n does not correspond to the certain property indicated by the last bit, wait until an edge in the last divider output signal 107n occurs such that after this edge in the last divider output signal 107n the actual property of the last divider output signal 107n corresponds to the certain property indicated by the last bit, before the output signal provider 109 starts the further verification. As an example, if the last bit indicates a low state of the last divider output signal 107n and the state of the last divider output signal 107n is a high state, then the output signal provider 109 may wait until the last divider output signal 107n changes its state from high to low and may not start the further verification before this signal edge occurred in the last divider output signal 107n.

Figure 3A:
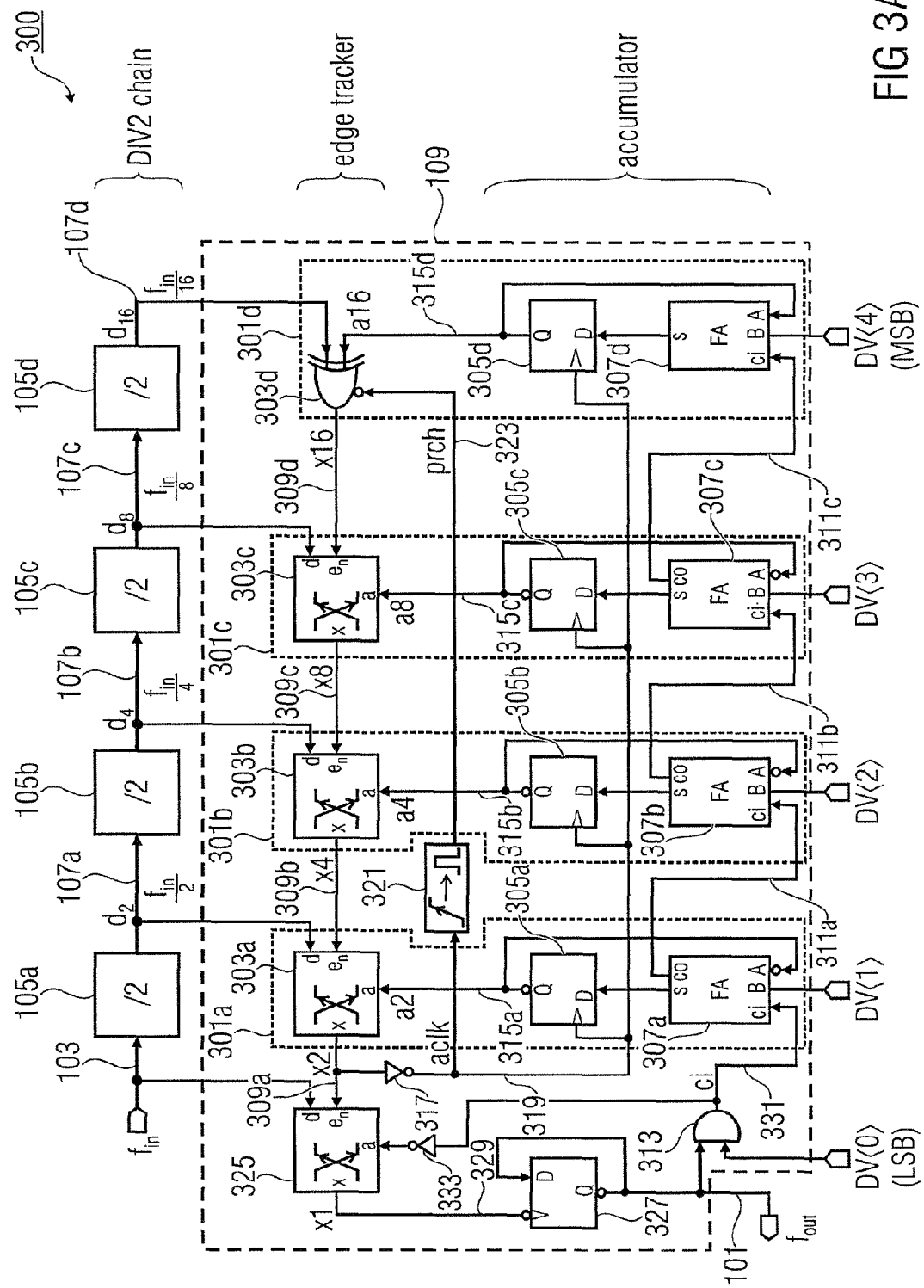
FIG. 3a shows a block schematic diagram of a divider according to a further embodiment of the present invention.

FIG. 3a shows a block schematic diagram of a divider 300. According to a further embodiment of the present invention the divider 300 may be also called a cyclic multi-modulo divider as the divider 300 may run continuously without the need for resetting which leads to a very power efficient operation.

The divider 300 may be a possible implementation of the divider 100, wherein in the example shown in FIG. 3a the divider 300 comprises four divider elements 107a to 107d. Nevertheless, as already described, the number of divider elements in the chain of divider elements of a divider according to embodiments of the present invention may be arbitrary and may depend on the needed divider value.

Furthermore, FIG. 3a shows a possible implementation for the output signal provider 109 which is based on an accumulator (e.g. comprising a ripple adder and registers, such as flip flops) in conjunction with a plurality of signal trackers 301a to 301d and a reference signal edge tracker 325 as will be described in the following.

As already mentioned, the chain of divider elements 105a to 105d comprises four divider elements 105a to 105d. A first divider element 105a is configured to receive the reference signal 103 having the reference frequency $f_{in}$. The first divider element 105a is configured to provide the first divider output signal 107a based on the reference signal 103 such that the first divider output signal frequency is half of the reference frequency $f_{in}$. A second divider element 105b is configured to receive the first divider output signal 107a and provide, based on the first divider output signal 107a, a second divider output signal 107b having a second divider output frequency which is half of the first divider output frequency and, therefore, is ¼ of the reference frequency $f_{in}$. A third divider element 105c is configured to receive the second divider output signal 107b and provide a third divider output signal 107c based on the second divider output signal 107b having a third divider output frequency which is half of the second divider output frequency and, therefore, which is ⅛ of the reference frequency $f_{in}$. A fourth divider element 105d which is also the last divider element 105d in the chain of divider elements 105a to 105d is configured to receive the third divider output signal 107c and provide, based on the third divider output signal 107c, a fourth and last divider output signal 107d having a fourth or last divider output signal frequency which is half of the third divider output frequency and which is therefore ¹⁄₁₆ of the reference frequency $f_{in}$.

The first divider output signal 107a is also designated as d2, the second divider output signal 107b is also designated as d4, the third divider output signal 107c is also denoted at d8 and the last divider output signal 107d is also denoted as d16. As can be seen from FIG. 3a, all of the divider elements 105a to 105d in the chain of divider elements 105a to 105d are DIV2 elements (divide by 2 elements). DIV2 elements have the advantage over known DIV23 elements in that they are much easier to implement and, therefore, more power efficient.

The output signal provider 109 comprises, for each divider element 105a to 105d of the chain of divider elements 105a to 105d, a verification stage 301a to 301d. Each verification stage 301a to 301d is configured to verify for each toggle state that the actual property of the divider output signal of its divider element corresponds to the associated bit in the toggle state. Furthermore, as will be shown in the following, the output signal provider 109 may be configured to activate a given verification stage for a given divider element only after a verification has been performed by another given verification stage for another given divider element, which directly succeeds the given divider element in the chain.

As an example, the output signal provider 109 may comprise a first verification stage 301a for the first divider element 105a, a second verification stage 301b for the second divider element 105b, a third verification stage 301c for the third divider element 105c and a fourth or last verification stage 301d for the last divider element 105d. As an example, the output signal provider 109 may be configured to activate the third verification stage 301c, only after a verification has been successfully performed by the last verification stage 301d. Furthermore, the output signal provider 109 may be configured to activate the second verification stage 301b only after a successful verification has been performed by the third verification stage 301c and may be configured to activate the first verification stage 301a only after a successful verification has been performed by the second verification stage 301b.

Each of the verification stages may comprise a signal tracker 303a to 303d, a flipflop 305a to 305d and a full adder 307a to 307d. The full adders 307a to 307d form a ripple adder. The ripple adder and the flipflops 305a to 305d form the accumulator of the output signal provider 109. According to further embodiments, instead of using a ripple adder, other adder implementations are possible also.

The verification stages 301a to 301c may be identical in one embodiment. The last verification stage 301d may differ from the other verification stages 301a to 301c in that another signal tracker 303d is implemented. As can be seen from FIG. 3a the signal tracker 303d of the last verification stage 301.d is an XOR gate 303d, while the signal trackers 303a to 303c are edge trackers 303a to 303c. Hence, the last verification stage 301d differs from the other verification stages 301a to 301c in that it looks after states of the last divider output signal 107d in contrast to the other verification stages 301a to 301c which look after signal edges in the divider output signals 107a to 107c. In other words, the certain property of the last divider output signal 107d which is verified by the verification stage 301d is a signal state of the last divider output signal 107d while in the other verification stages 301a to 301c this certain property is a signal edge in the respective divider output signal 107a to 107c.

As the verifications are performed subsequently by the verification stages 301a to 301d, each verification stage 301a to 301c, except the last verification stage 301d, receives an activation signal 309b to 309d from the verification stage of the directly succeeding divider element 105b to 105d. As an example, the first edge tracker 303a receives a second activation signal 309b from the second edge tracker 303b, the second edge tracker 303b receives a third activation signal 309c from the third edge tracker 303c and the third edge tracker 303c receives a fourth activation signal 309d from the XOR gate 303d. Furthermore, the first edge tracker 303a provides a first activation signal 309a to the reference signal edge tracker 325.

In the example shown in FIG. 3a enable inputs of the edge trackers 303a to the 303c are active low.

An edge tracker 303a to 303c, 325 becomes active when the activation signal 309a to 309d received at its enable input "en" is low (e.g., logical zero). For a high state of the activation signal 309a to 309d at its enable input "en" an edge tracker 303a to 303c, 325 outputs a logical high at its output "x."

Furthermore, each edge tracker 303a to 303c comprises a data input "d" at which it receives the divider output signal 107a to 107c of its divider element 105a to 105c. Furthermore, each edge tracker 303a to 303c comprises a verification input "a" at which it receives a toggle state signal 315a to 315c which is based on the bit of the toggle state associated with the divider output signal 107a to 107c of its divider element 105a to 105c. Furthermore, outputs "x" of the edge trackers 303a to 303c at which the edge trackers 303a, 303b, 303c provide the activation signals 309a, 309b, 309c are in the example shown in FIG. 3a low active, i.e., upon a successful verification the outputs "x" of the edge trackers become logical zero.

The full adders 307a to 307d and the flipflops 305a to 305d together form an accumulator, which is configured to determine the toggle states for which the output signal 101 is to be toggled. The full adders 307a to 307d may be a one bit full adder, which are configured to add three one bit numbers: ci, A, B. Each full adder 307a to 307d is configured to receive its "ci" signal from a preceding stage, in detail, the fourth full adder 307d is configured to receive at its "ci" input a third carry out signal 311c from the third full adder 307c. The third full adder 307c is configured to receive at its "ci" input a second carry out signal 311b from the second full adder 307b. The second full adder 307b is configured to receive at its "ci" input a first carry out signal 311a from the first full adder 307a.

Furthermore, each of the full adders 307a to 307d is configured to receive at its "B" input a bit of the divider value, wherein the last full adder 307d receives the most significant bit, e.g., representing a value of $2^n$, wherein n is number of the corresponding divider element in the chain of divider elements 105a to 105d.

In the example shown in FIG. 3a, the fourth full adder 307d receives at its "B" input the bit of the divider value having the bit value $2^4$, the third full adder 307c receives at its "B" input the bit of the divider value having the bit value $2^3$, the second full adder 307b receives at its "B" input the bit of the divider value having the bit value $2^2$ and the first full adder 307a receives at its "B" input the bit of the divider value having the bit value $2^1$. The least significant bit of the divider value (having the bit value 2°) is provided to an AND gate 313, an output signal (also designated as carry in signal 331) of which is provided to the "ci" input of the first full adder 307a, as will be described later on.

Sum outputs "S" of the full adders 307a to 307d of the verification stages 301a to 301d are connected to data inputs "D" of the respective flipflops 305a to 305d of the verification stages 301a to 301d. The actual toggle state is stored in the flip-flops 305a to 305d.

An output "Q" of each flipflop 305a to 305d of each verification stage 301a to 301d is fed back to an "A" input of the full adder 307a to 307d of the respective verification stage 301a to 301d. As can be seen in FIG. 3a the outputs of the flip-flops 305a to 305c are inverted and the "A" inputs of the full adders 307a to 307c are inverted. The output of the flipflop 305d of the last verification stage 301d and the "A" input of the full adder 307d of the last verification stage 301d are non-inverted inputs. Each output "Q" of the flipflops 305a to 305d is further connected to the verification input "a" of the edge tracker 303a to 303d of the respective verification stage 301a to 301d. Hence, toggle state signals 315a to 315d provided at the outputs of the flipflops 305a to 305d define the certain properties which are to be verified by the verification stage 301a to 301d (e.g., the type of edge for the edge tracker 303a to 303c and the logical state for the XOR gate 303d).

Hence, the XOR gate 303d of the last verification stage 301d is configured to perform a logical XOR combination of the last divider output signal 107d and a last toggle state signal 315d to determine the last activation signal 309d. The toggle state signals 315a to 315c are provided at the negated outputs of the flipflops 305a to 305c, because the edge trackers 303a to 303c are configured such that for a low state at the verification input "a", the corresponding edge tracker 303a to 303c waits for a rising edge to occur and for a high state at the verification input "a", the corresponding edge tracker 303a to 303c waits for a falling edge to occur in the received divider output signal 107a to 107c. Of course, an inverted implementation of the edge tracker 303a to 303c would be possible also.

The first activation signal 309a is provided to a first inverter 317, an output signal of which is used as clock signal 319 (also designated as aclk) for the accumulator formed by the flipflops 305a to 305d and the full adders 307a to 307d. As can be seen in FIG. 3a the clock signal 319 is provided to clock inputs of the flipflops 305 to 305d such that for a predefined type of edge in the clock signals 319 (in the example for a rising edge of the clock signal 319) a new toggle state is derived by means of the accumulator.

In an inverted implementation the inverter 317 may be omitted and the clock inputs of the flipflops 305a to 305d may be directly connected to the output "x" of the first edge tracker 301a.

It can be seen that the accumulator is running at twice the low MMD output frequency and not at the high reference frequency $f_{in}$. Hence, the determination of the toggle states can be performed using this easy to implement accumulator as a frequency of the clock signal is comparatively low.

Furthermore, the clock signal 319 is provided to an edge to pulse converter 321 which is configured to convert a rising edge in the clock signal 319 to a pulse. An output signal 323 (also designated as prch) of the rising edge to pulse converter 321 is provided to a pre-charge input of the XOR gate 303d. The XOR gate 303d is configured to reset the activation signal 309d in response to a pulse in the output signal 323 of the rising edge to pulse converter 321. In this case, the resetting means that the last activation signal 309d is set to a high state (e.g., logical 1). By propagation through the edge trackers 303c to 303a and 325 all edge trackers 303a to 303c, 325 are reset, in response to a high state of the last activation signal 309d.

Furthermore, as already pointed out, the output signal provider 109 comprises the reference signal edge tracker 325 configured to track signal edges in the reference signal 103. A structure or implementation of the reference signal edge tracker 325 may be identical to a structure or implementation of the edge trackers 303a to 303c in one embodiment. The reference signal 103 is provided to a data input "d" of the reference signal edge tracker 325 and the first activation signal 309a is provided to an enable input "en" of the reference signal edge tracker 325.

Furthermore, the output signal provider 109 comprises a toggle flipflop 327 configured to toggle the output signal 101 in response to a predetermined signal edge at its clock input. The toggle flipflop 327 is configured to receive a toggle signal 329 at its clock input which is provided by the reference signal edge tracker 325 at its output "x." Hence, the toggle flipflop 327 is configured to toggle the output signal 101 at a predefined type of edge (in the present case at a falling edge) of the toggle signal 329. This can be seen in the fact that the clock input of the toggle flipflop 327 is inverted. Other (non-inverted) implementations would be possible also.

The toggling in the toggle flipflop 327 is achieved in that an inverted output "Q" of the toggle flipflops 327 is fed back to the input "D" of the toggle flipflop 327. A flipflop output signal provided at this inverted output "Q" of the toggle flipflop 327 is the output signal 101.

The output signal 101 is further provided to a first input of the AND gate 313. The least significant bit of the divider value is provided to a second input of the AND gate 313. Hence, the AND gate 313 is configured to perform a logical AND combination of the output signal 101 and the least significant bit of the divider value to derive the carry in signal 331 which is provided to the carry in input "ci" of the full adder 307a of the first verification stage 301a.

From the combination performed by the AND gate 313 it follows that for even divider values this carry in signal 331 has always the value logical zero. Hence, for even divider values the next toggle state is always determined by adding half of the divider value to the actual toggle state. For odd divider values (in which the least significant bit equals logical 1), the next toggle state is alternately derived by adding half of the divider value to the actual toggle state (if the output signal 101 equals logical zero) or by adding half of the divider value increased by one to the actual toggle state (when the output signal 101 equals logical 1). Furthermore, the carry in signal 331 is provided to another inverter 333 of the output signal provider 109. An output signal of the other inverter 333 is provided to a verification input "a" of the reference signal edge tracker 325. Hence, for even divider values the predetermined edge in the reference signal 103 at which the output signal 101 is toggled by the output signal provider 109 is a falling edge, as the carry in signal 331 is always the value logical zero for even divider values.

For odd divider values the output signal 101 is alternately toggled with a rising edge in the reference signal 103 and a falling edge in the reference signal 103.

As will be shown in the following, by having the toggling of the output signal 101 alternately and by alternately adding the divider value integer divided by two and the divider value integer divided by two and increased by one to the actual toggle state, a 50% duty cycle in the output signal 101 can be achieved even for odd divider values.

In other words, the output signal provider 109 is configured to, for an even divider value, determine the next toggle state for which the output signal 101 is to be toggled the next time, by adding half of the divider value to a last toggle state for which the output signal 101 was toggled the last time.

Furthermore, as can be seen from FIG. 3a, the output signal provider 109, or in more detail the accumulator of the output signal provider 109, is configured to perform its addition modulo $2^N$ wherein N is a number of divider elements 105a to 105d in the chain of divider elements 105a to 105d. Hence, in the present case shown in FIG. 3a, the accumulator is configured to perform the additions modulo 16.

To summarize, the output signal provider 109 of the divider 300 is configured to provide the output signal 101 such that the duty cycle of the output signal 101 is 50% (for even divider values and for odd divider values).

Figure 3B:
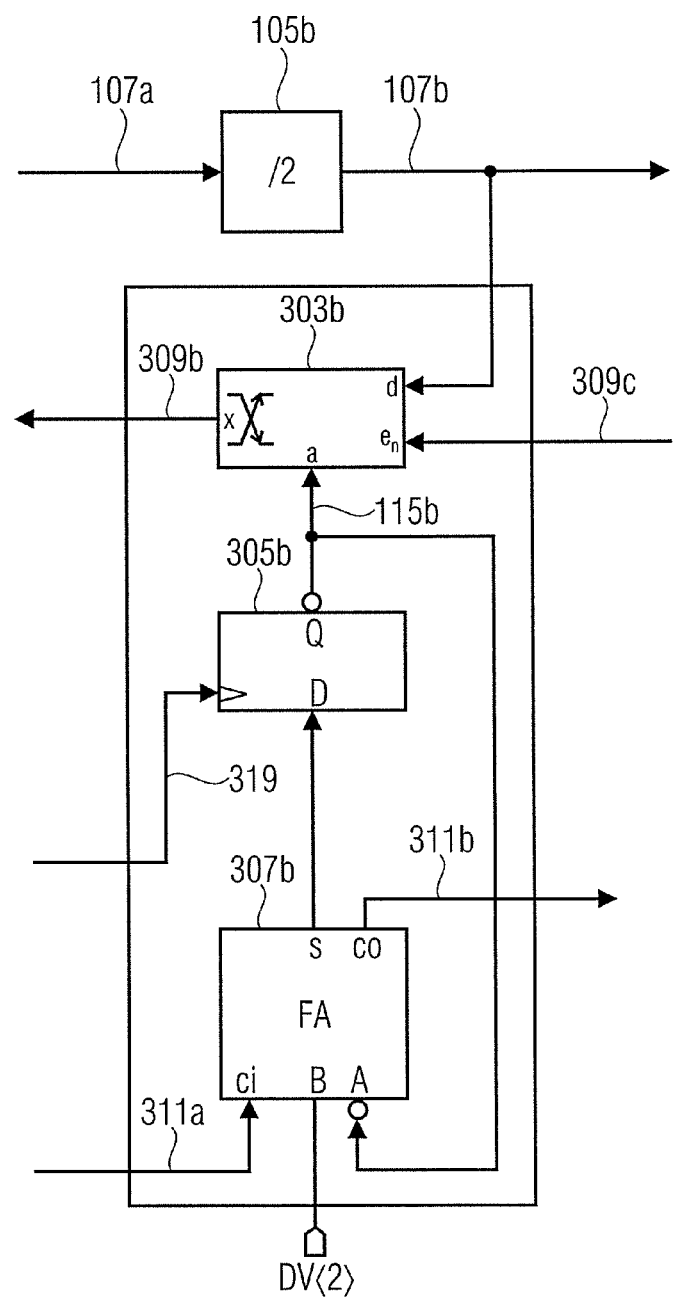

FIG. 3b shows a single slice comprising the second divider element 105b and the second verification stage 301b. The divider 300 shown in FIG. 3a can be extended arbitrary by adding a plurality of such slices shown in FIG. 3b between the first slice comprising the first divider element 105a and the first verification stage 301a and the last slice comprising the last divider element 105d and the last verification stage 301d. Hence, the divider 300 shown in FIG. 3a can be easily extended to different maximum divider values.

Figure 4:
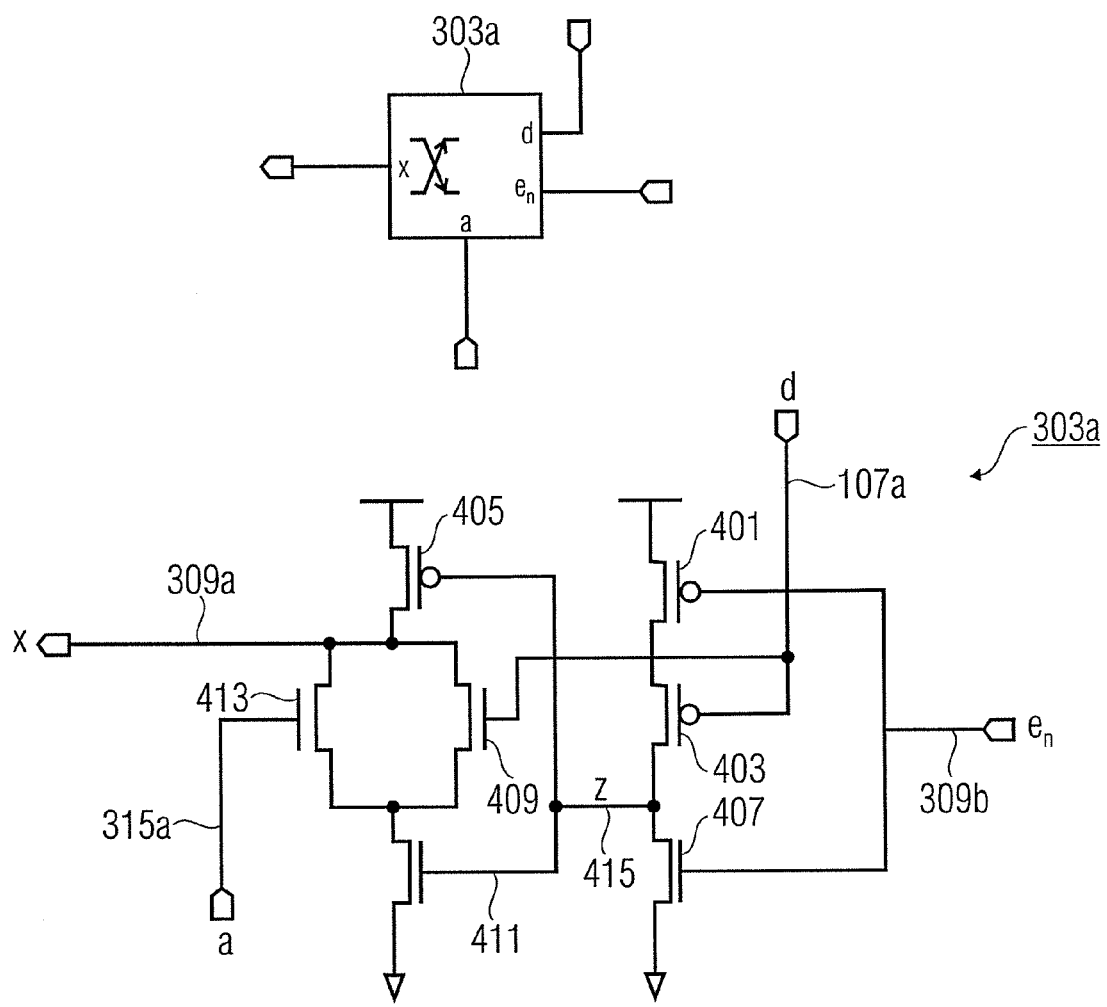
FIG. 4 shows a schematic of an edge tracker according to an embodiment of the present invention.

FIG. 4 shows a schematic of the first edge tracker 303a according to an embodiment of the present invention. Nevertheless, this schematic is also applicable for the edge tracker 325, 303b, 303c as these edge trackers are identical.

The edge tracker 303a comprises a first transistor 401 of a first transistor type, a second transistor 403 of the first transistor type and a third transistor 405 of the first transistor type. Furthermore, the edge tracker 303a comprises a first transistor 407 of a second transistor type, a second transistor 409 of the second transistor type, a third transistor 411 of the second transistor type and a fourth transistor 413 of the second transistor type.

As an example, a transistor of the first transistor type may be a PMOS transistor or a PNP transistor. A transistor of the second type may be an NMOS transistor or an NPN transistor. In the detailed example in FIG. 4, a transistor of the first transistor type is a PMOS transistor and a transistor of the second transistor type is an NMOS transistor. Hence, a transistor from the first transistor type will be called a PMOS transistor and a transistor from the second transistor type will be called NMOS transistor.

Nevertheless, the edge tracker may be also implemented in an inverted fashion and/or using another transistor technology.

A first terminal (e.g., a source terminal) of the first PMOS transistor 401 is connected to a supply voltage terminal. A second terminal (e.g., a drain terminal) of the first PMOS transistor 401 is connected to a first terminal (e.g., a source terminal) of the second PMOS transistor 403, a second terminal (e.g., a drain terminal) of the second PMOS transistor 403 is connected to a second terminal (e.g., a drain terminal) of the first NMOS transistor 407. A first terminal (e.g., a source terminal) of the first NMOS transistor 407 is connected to a ground potential terminal. At the supply potential terminal typically a supply potential is applied and at the ground potential terminal typically a ground potential is applied. A control terminal (e.g., a gate terminal) of the first NMOS transistor 407 and a control terminal (e.g. a gate terminal) of the first PMOS transistor 401 are connected to the enable input "en" of the edge tracker 303a (e.g., for receiving an activation signal, such as the second activation signal 309b, from a preceding edge tracker). A control terminal (e.g., a gate terminal) of the second PMOS transistor 403 is connected to the data input "d" of the edge tracker 303a (e.g., for receiving a divider output signal such as the first divider output signal 107a). A control terminal (e.g., a gate terminal) of the third PMOS transistor 405 is connected to a control terminal (e.g., a gate terminal) of the third NMOS transistor 411 and to the second terminals of the second PMOS transistor 403 and the first NMOS transistor 407. A first terminal (e.g., a source terminal) of the third PMOS transistor 405 is connected to the supply voltage terminal. A second terminal (e.g., a drain terminal) of the third PMOS transistor 405 is connected to the output "x" of the edge tracker 303a at which the edge tracker 303a provides it output signal (e.g., the first activation signal 309a). A second terminal (e.g., a drain terminal) of the second NMOS transistor 409 is connected to the output "x" of the edge tracker 303a. A first terminal (e.g., a source terminal) of the second NMOS transistor 409 is connected to a second terminal (e.g., a drain terminal) of the third NMOS transistor 411 and to a first terminal (e.g., a source terminal) of the fourth NMOS transistor 413. A control terminal (e.g., a gate terminal) of the second NMOS transistor 409 is connected to the data input "d" of the edge tracker 303a. A control terminal (e.g., a gate terminal) of the third NMOS transistor 411 is connected to the second terminals of the second PMOS transistor 403 and the first NMOS transistor 407. A first terminal (e.g., a source terminal) of the third NMOS transistor 411 is connected to the ground potential terminal. A control terminal (e.g., a gate terminal) of the fourth NMOS transistor 413 is connected to the verification input "a" of the edge tracker 303a (e.g., for receiving the first toggle state signal 315a). In the following, the working principle of the edge tracker shown in FIG. 4 shall be described in more detail.

FIG. 5c shows a signal diagram for the different possible states of the edge tracker 303a.

The edge tracker 303a of FIG. 4 is built on the assumption that it is known that the data input "d" has a high state when the enable input "en" changes from one to zero. If the verification input "a" (e.g., the first toggle state signal 315a) has a logically high state, which means that we are looking after a falling edge in the first divider output signal 107a, the edge tracker 303a just has to wait until this falling edge occurs at the data input "d" (or in other words occurs in the first divider output signal 107a). Hence, for the case d=1, en=0 and a=1, the fourth NMOS transistor 413 is conducting and the first PMOS transistor 401 is conducting. If now a falling edge occurs at the data input "d," the second PMOS transistor 403 becomes conducting such that an internal signal 415 (also designated as z) becomes a high value. This leads to a conducting state of the third NMOS transistor 411 and to a low state of the first activation signal 309a at the output "x."

For detecting a rising edge in the first divider output signal 107a at the data input "d," the edge tracker 303a has to wait until the state from the first divider input signal 107a changes from logical 1 to logical 0 and from logical 0 back to logical 1. For detecting a rising edge in the first toggle state signal 315a which is provided at the verification input a has to have a low state, e.g., logical 0. Hence, in this case the fourth PMOS transistor 413 is in a high impedance state (or non-conducting state). If now the first divider output signal 107a falls from logical 1 to logical 0, ground potential is applied to the first terminal of the second NMOS transistor 409 (by means of the conducting third NMOS transistor 411). If now the first divider output signal 107a has a rising edge (goes from logical 0 to logical 1) the second NMOS transistor 409 becomes conducting such that the ground potential at the first terminal of the second NMOS transistor 409 is applied to the output "x" of the edge tracker 303a. This leads to a low state of the first activation signal 309a.

Furthermore, the edge tracker 303a is configured such that for a logical 1 at its enable input "en," the first activation signal 309a has always the value logical 1 (by means of the conducting first NMOS transistor 407 and the conducting third PMOS transistor 405).

According to further embodiments of the present invention, the edge tracker may be used in other applications than the divider 300 in which an efficient edge tracking of an input signal from a known state of the input signal (e.g., provided at the data input d of the edge tracker) is to be tracked.

In the implementation shown in FIG. 3a, only six transistors receive the high frequency reference signal 103. As an example, four transistors of the first divider element 105a may receive the reference signal 103 (when the first divider element 105a is implemented as a standard DIV2 element). Furthermore, as can be seen from FIG. 4, only the transistors 409 and 403 of the edge tracker 303a shown in FIG. 4 are connected to the data input "d" of the edge tracker 303a as the reference signal edge tracker 325 has the same structure as the first edge tracker 303a. As already pointed out, only these two transistors of the reference signal edge tracker 325 receive the reference signal 103. Hence, only a very small amount of elements of the divider 300 receive the reference signal 103 having the reference frequency $f_{in}$ which is the highest frequency in the divider 300. Especially when compared to multi-modulo dividers employing DIV23 elements, a reduction in power consumption can be achieved.

Figure 5A:
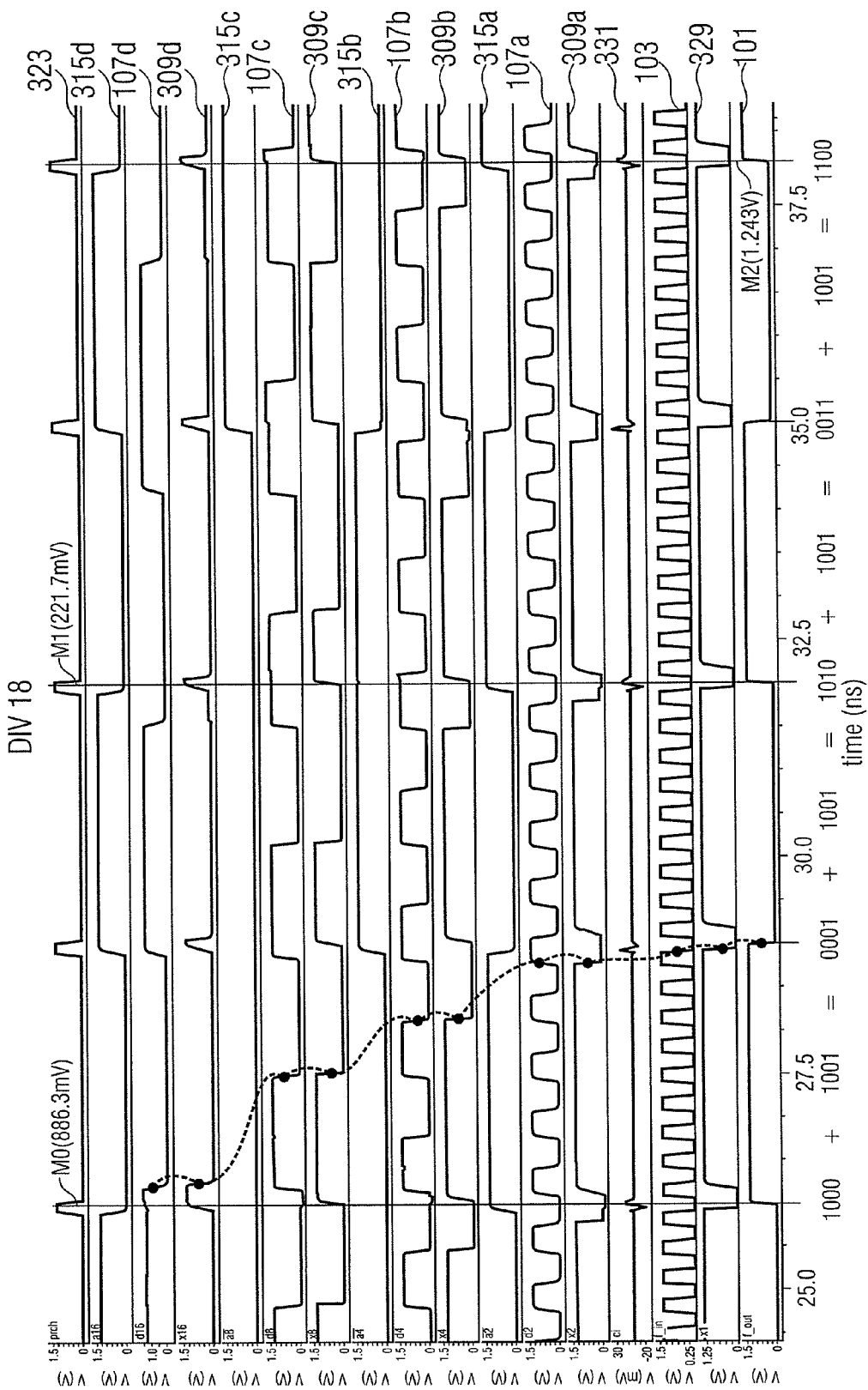

FIG. 5a illustrates the working principle of the divider 300 shown in FIG. 3a for a divider value of 18. As the divider value equals 18, the output signal 101 should be alternately low for nine input cycles of the reference signal 103 then be high for nine input cycles of the reference signal 103. To this end, the output signal provider 109 has to detect every nine counts to toggle the output signal 101. The toggle states (as stored in the flipflop 305a to 305d) are noted at the bottom of FIG. 5a starting with the most significant bit of the toggle state (stored in the last flipflop 305d of the last verification stage 301d) to the least significant bit of the toggle state (stored in the first flipflop 305a of the first verification stage 301a).

It should be noted that the toggle state signals 315a, 315b and 315c are shown in FIG. 5a in an inverted manner. Hence, FIG. 5a shows the toggle states a2 to a16 as they are stored in the flipflop 305a to 305d. As already described, the toggle state stored in the flipflop 305a to 305c are provided in an inverted version to the verification input "a" of the respective edge trackers 303a to 303c.

Starting with 1000 at left, always 1001 (=9) is added. Due to the four stage counter, the addition is done modulo $2^4$, e.g., 8+9=17=1 (modulo 16)=0001. To detect when 9 input cycles have happened, we associate the binary pattern for 1 which is 0001 with: a low state of the last divider output signal 107d, a falling edge of the third divider output signal 107c, a falling edge of the second divider output signal 107b and a rising edge of the first divider output signal 107a. If these edges happened, then with the next predetermined edge of the input signal 103 (in this case with the next falling edge of the input signal 103) the output signal 101 is toggled. The dashed line in FIG. 5a running from the last divider output signal 107d to the output signal 101 shows this process of the subsequent verifications performed by the verification stages 301a to 301d (starting with the last verification stage 301d and finishing with the first verification stage 301a).

In FIG. 5a the meaning of the name cyclic multi-modulo divider becomes apparent as the whole process forms a large cycle due to overflow of the counter.

The next toggle state is derived using the accumulator running at twice the low MMD output frequency ($f_{out}=f_{in}/$DIVVAL). In the example while the toggle state 0001 is to be detected, the accumulator can take up to one half of the period of the output signal 101 to compute in background the next state which is 1010 (1+9=10). As an example, for a reference frequency $f_{in}$ of 5 GHz and a divider value of 18, the accumulator has 1.8 nanoseconds time. This addition can be done with a cheap ripple adder (as implemented using full adders 307a to 307d). Hence, as seen in FIG. 3b, an entire multi-modulo divider bit slide contains the divider element (e.g., a DIV2 element) on top, then an edge tracker and a part accumulator comprising a flip-flop and a full adder.

To summarize, even divider values are handled by letting the counter run for divider value divided by 2 input cycles and then toggle the output signal 101.

Odd divider values are special in that, to maintain the 50% output duty cycle in the output signal 101, an inspection of the rising input edge of the input signal 103 is required.

In this case, the toggling of the output signal 101 is delayed for one half of the input cycle. To make sure that the output cycle contains (divider value integer divided by 2)×2+1 input cycles, a correction of plus 1 is fed into the accumulator via the input carry 331 to make it count for one more cycle every second output half cycle.

Figure 5B:
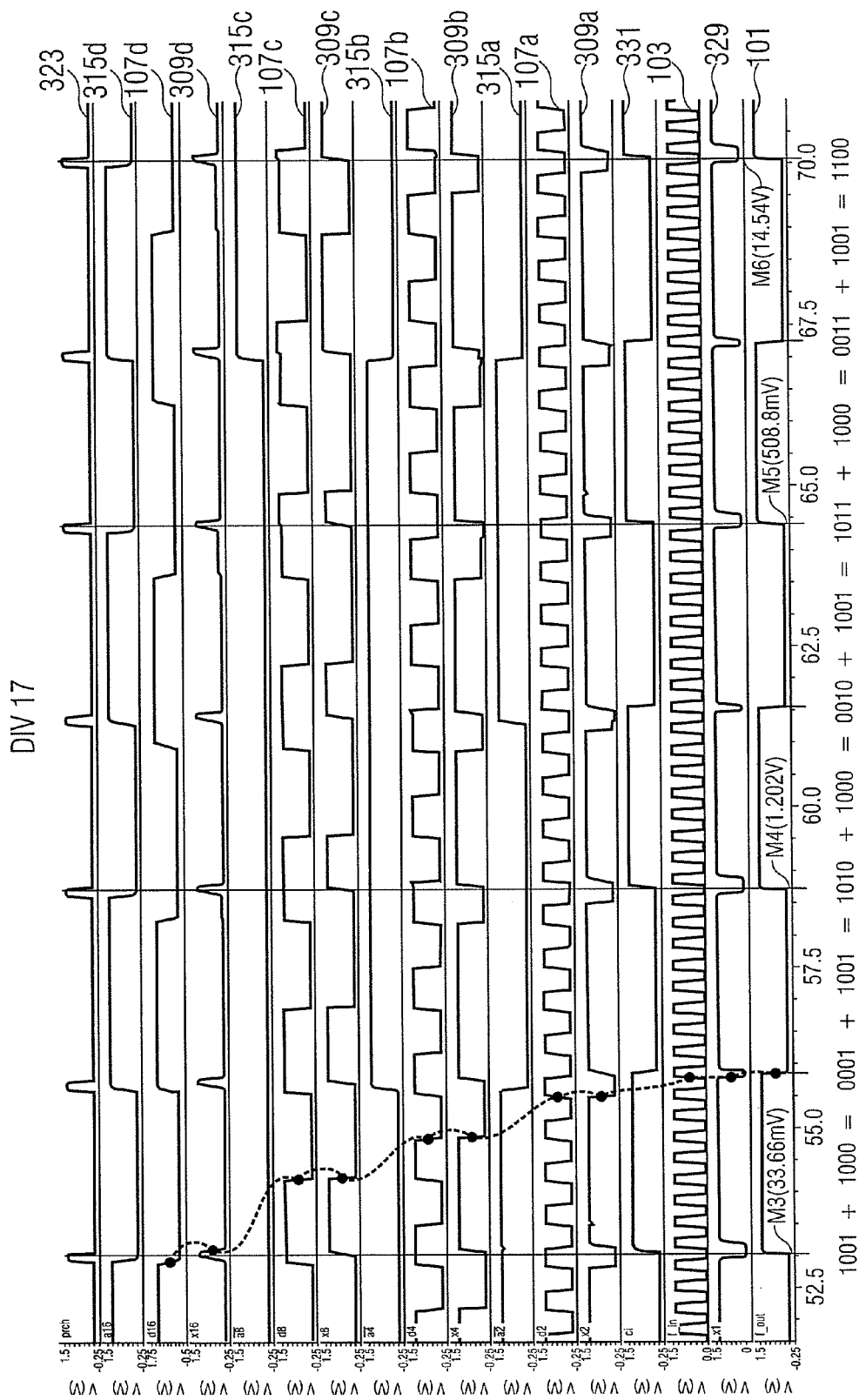

This can be seen in FIG. 5b in which the divider 300 is configured to divide the input frequency $f_{in}$ by the divider value 17.

Starting from a counter value of 1001 alternately 1000 (which is the divider value 17 integer divided by 2) and 1001 (which is the divider value 17 integer divided by 2 and increased by 1) is added to the last toggle state.

According to further embodiments, to minimize duty cycle deviations a different method for producing the actual divided output signal 101 is followed for even and odd divider values: in the first case the toggle flipflop 327 may be used, while in the latter case the respective input edge may be directly passed to the output with a multiplexer deciding between even or odd. In other words, the toggle flipflop 327 of the divider 300 may be used, according to some embodiments of the present invention only for toggling the output signal 101 in the case of even divider values, while in the case of odd divider values a multiplexer is used for toggling the output signal 101.

To summarize, the output signal provider 109 is configured to, for an even divider value, determine a next toggle state for which the output signal 101 is to be toggled to the next time, by adding half of the divider value to a last toggle state for which the output signal 101 was toggled the last time.

Furthermore, the output signal provider 109 is configured to, for an odd divider value, determine a next toggle state for which the output signal 101 is to be toggled the next time by alternately adding the divider value integer divided by 2 to a last toggle state for which the output signal 101 was toggled the last time and adding the divider value integer divided by 2 and increased by 1 to the last toggle state for which the output signal 101 was toggled the last time.

Furthermore, the output signal provider 109 is configured to, for the odd divider value, in the case the next toggle state is determined by adding the divider value integer divided by 2 and increased by 1 to the last toggle state, toggle the output signal at an edge from a first type of edges out of rising edge and falling edge in the reference signal 103 occurring after the verification of the first verification stage 301a has been successfully performed. In the example of FIG. 3a, the first type of edges is a rising edge in the input signal 103. In the case the next toggle state is determined by adding the divider value integer divided by 2 to the last toggle state, the output signal provider 109 is configured to toggle the output signal 101 at an edge from a second type of edges out of rising edge and falling edge in the reference signal 101 which succeeds at least a further edge from the first type of edges in the reference signal, this further edge occurring after the first verification performed by the first stage 301a has been successfully performed. The second type of edge is in the case of the divider 300 a falling edge.

In other words, for the case in which the next toggle state is determined by adding the divider value integer divided by 2 to the last toggle state, one edge in the reference signal 103 is swallowed. Furthermore, the output signal provider 109 checks, for toggling the output signal 101, alternately for rising edges and falling edges in the reference signal 103. In contrast to this, for even divider values, the output signal provider 109 may always check the same type of edge in the reference signal 103.

To summarize, the divider 300 comprises the plurality of divider elements 105a to 105d which are arranged in the chain of divider elements 105a to 105d. The output signal provider 109 is configured to, for each toggle state, subsequently, starting with the last divider element 105d, verify that an actual property of each divider output signal 107a to 107d of each divider element 105a to 105d corresponds to the certain property indicated by the associated bit in the toggle state. Only after all verifications have been completed the output signal provider 109 toggles the output signal 101 at the predetermined edge in the reference signal 100. For even divider values the predetermined edge may be for each toggle state from the same type of edges (falling edge in the case of the divider 300) and may alternate between falling edge and rising edge for every new toggle state in the case of odd divider values.

Furthermore, the output signal provider 109 comprises a verification stage 301a to 301d for each divider element 105a to 105d in the chain. Each verification stage 301a to 301d is configured to verify for each toggle state that the actual property of the divider output signal 107a to 107d of its divider element 105a to 105d corresponds to the associated bit in the toggle state. Furthermore, the output signal provider 109 is configured to activate a given verification stage (out of the verification stages 301a to 301d) for a given divider element 105a to 105d only after a verification has been performed by another given verification stage (of the verification stages 301a to 301d) for another given divider element 105a to 105d which directly succeeds the given divider element 105a to 105d in the chain. As an example, the second verification stage 301b is activated, after the verification performed by the third verification stage 301c was successful. To achieve this, every verification stage 301a to 301d outputs its activation signal 309a to 309d for activating the verification stage 301a to 301c of the divider element 105a to 105c which precedes the divider element 105a to 105d of the current verification stage 301a to 301d.

Furthermore, the output signal provider 109 is configured to reset the signal trackers 303a to 303d, 325 after a verification has been performed by the first verification stage 301a for the first divider element 105a. This can be seen by the feedback loop from the output "x" of the first edge tracker 301a to the pre-charge input of the XOR gate 303d. A pulse in this pre-charge signal 323 leads to a high level of the last activation signal 309d which leads to a reset of the third edge tracker 303c, the second edge tracker 303b, the first edge tracker 303a and the reference signal edge tracker 325.

In the following some aspects of embodiments of the present invention shall be summarized. A multi-modulo divider according to embodiments of the present invention have the following advantages over a DIV23 architecture:

1. Instead of complex DIV23 cells, only simple DIV2 cells may be employed with only half the current consumption.
2. Whereas conventional MMDs operate on rising edges only, a multi-modulo divider according to an embodiment of the present invention evaluates falling edges and rising edges and therefore achieves 50% duty cycle for all divider values (for even divider values and odd divider values).
3. As can be seen from FIG. 3a, a core of some multi-modulo dividers according to embodiments of the present invention is a DIV2 chain working as a binary counter which has no range limitations. Therefore, no reset of the counter or the accumulator in the divider 300 is necessary.

Embodiments of the present invention may be used at different positions in an RF transceiver.

Figure 6A:
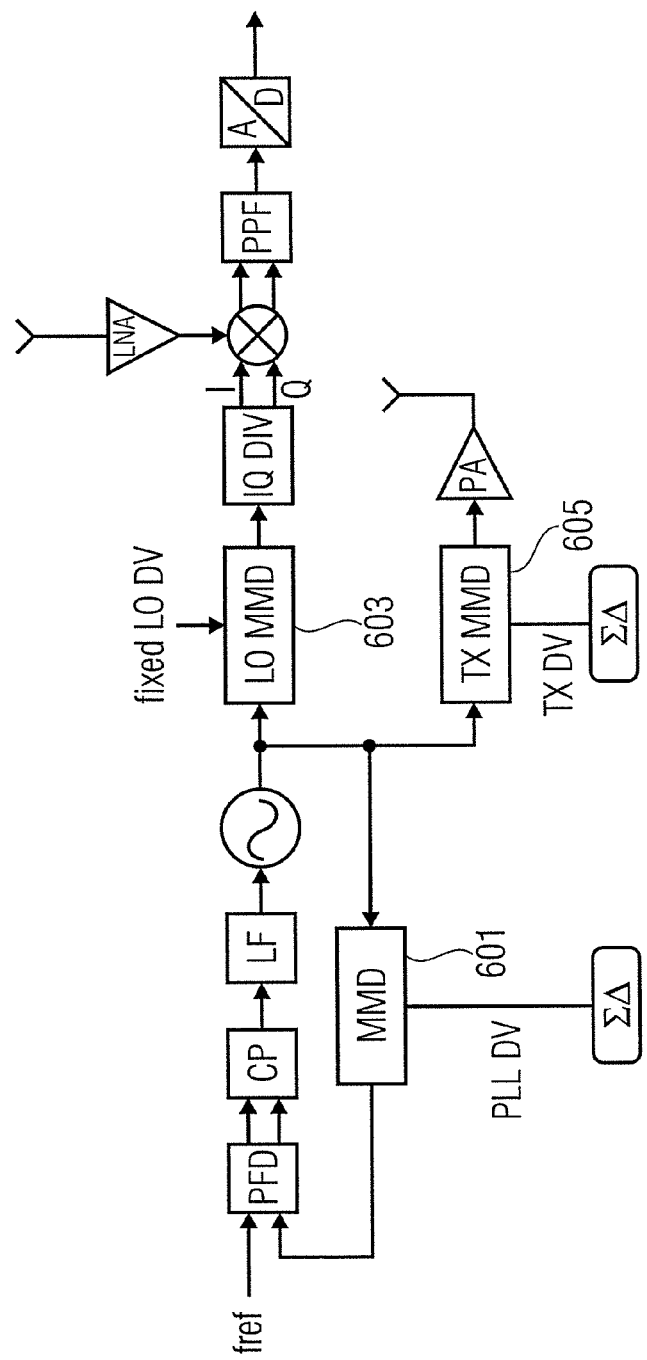
FIG. 6a shows a block schematic diagram of a mobile communication device according to an embodiment of the present invention.

FIG. 6a shows an exemplary transceiver PLL according to an embodiment of the present invention comprising three multi-modulo dividers: a feedback multi-modulo divider 601, a local oscillator multi-modulo divider 603 for the receive path and a transmit multi-modulo divider 605 for the transmit path. One or more, or each, of the multi-modulo dividers 601, 603, 605 may be a divider according to an embodiment of the present invention (e.g., the divider 100 or the divider 300).

As already mentioned, the MMD output duty cycle is significant in two scenarios:

1. MMD output harmonics are directly relevant in a transmitter application.
2. In IQ signal generation a division of the frequency by four is to take place if the input duty cycle is not equal to 50%. In contrast, when the input cycle is exactly 50% a division by two is sufficient for IQ generation.

Figure 6B:
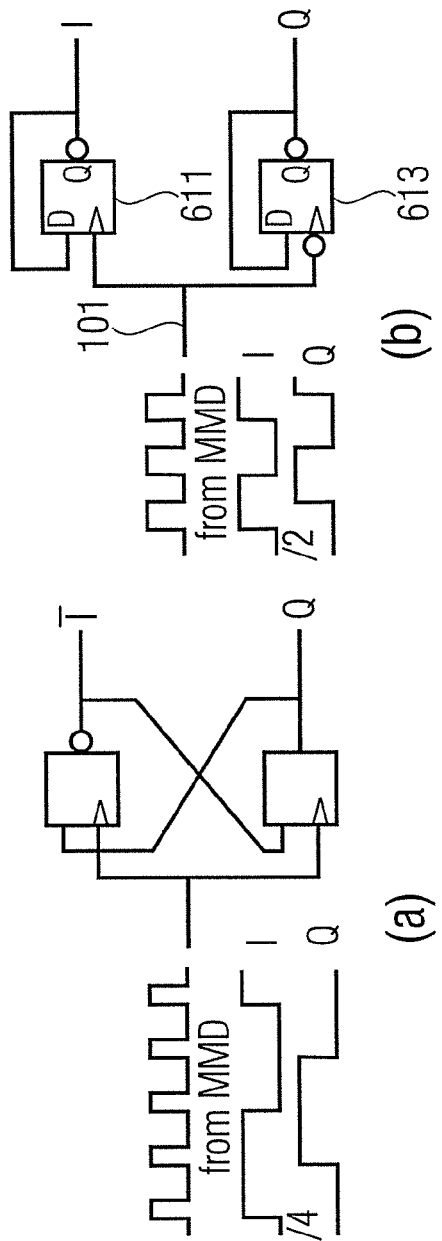
FIG. 6b shows the advantage of an IQ generation from a 50% duty cycle MMD output signal over the IQ generation from a non 50% duty cycle MMD output signal.

FIG. 6b illustrates the second fact. FIG. 6b shows on the left side (a) a conventional IQ generation from a non 50% duty cycle MMD output signal and on the right side (b) an IQ generation using a 50% duty cycle signal, as it may be provided as the output signal 101 from the divider 101 or the divider 300. On the right side the IQ generation is performed by a first toggle flipflop 611 which receives at its non-inverted clock input the divider output signal 101 and provides the I-clock-signal at its inverted Q output and by a second flipflop 613 which receives at its inverted clock input the output signal 101 and provides at its inverted Q output the Q-clock-signal.

As embodiments of the present invention are capable of producing a 50% duty cycle for even divider values and for odd divider values, the VCO frequency can be half if a divider, according to an embodiment of the present invention, is used for the IQ generation (e.g., as LO multi-modulo divider 603). By having only half of the VCO frequency a signification power reduction can be achieved when compared to conventional systems that are not capable of constantly producing a duty cycle of 50%. In ring oscillators it is easily possible to realize half a VCO frequency than in LC VCOs where the coil size is a limiting factor. Nevertheless, if the VCO frequency cannot be halved, at least a further DIV2 element can be inserted directly after the VCO thereby relaxing the power consumption of the LO chain. In any case, the relief from having to divide by four in order to generate IQ signals makes LO path design easier.

Furthermore, reducing the VCO frequency has another advantage as described in the following. As an example, considering a transceiver containing a plurality of different radios, e.g., 3G cellular, LTE, WLAN, GPS, Bluetooth and FM radio cross talk may appear. In particular the second harmonic of the GPS VCO may fall into the FM radio VCO band, for example, if it goes up to 6.4 GHz. An easy way to relax the situation without touching the VCO is to lower the maximum FM radio VCO frequency to about 6.2 GHz. This can be achieved by implementing the LO multi-modulo divider 603 according to an embodiment of the present invention and an IQ dividing circuit as shown in FIG. 6b on the right side. A current consumption of the LO MMD would therefore drop by about 60%. Furthermore, duty cycle deviations of embodiments of the present invention are much lower than duty cycles deviations of typical pulse swallowing MMDs. As an example, a transmit multi-modulo divider 605 according to embodiments of the present invention having a 50% duty cycle gives best linearity for the FM transmitter.

To summarize key ingredients of embodiments of the present invention are the following:

Using an energy efficient asynchronous counter.

A novel tracking method that adds only little loads to the counter.

A combination with a low frequency accumulator avoids expensive counter reload as the counter can run continuously.

The duty cycle of the output signal 101 is nominally 50% for all divider values (odd divider values and even divider values).

According to further embodiments, if duty cycle is not a concern then the output stages of the divider 300 may be simplified. In this case the special handling of odd divider values involving the evaluation of odd and even divider values can be omitted, thereby reducing the input load from 8 to 6 devices running at full rate and thus saving additional power.

As an example, the reference signal edge tracker 325 may be simplified as for odd divider values, not for every toggle state another edge in the reference signal 103 has to be tracked.

To summarize, a multi-modulo divider according to embodiments of the present invention use less than half of the power of a conventional DIV23 MMD while still offering 50% duty cycle.

Finally, we comment on the lower power consumption limit of any possible MMD based on CMOS logic. If one accepts the hypothesis that there is no other DIV2 element that uses significantly less energy than the 9-transistor TSPC DIV2 then the power consumption P of a DIV2 chain alone forms a lower bound to the minimum power X of any conceivable MMD as it computes only a subset of cases, i.e., it can only divide by $2^n$, $n \geq 1$. So P<X.

If one now has a MMD' with power P' adding only little overhead $\Delta$ to the DIV2 chain—as is the case for the present invention—then we have P'=P+$\Delta$<X+$\Delta$, i.e., MMD' is away from the (unknown) optimum X by at most $\Delta$. There can be in principle no other MMD with power<P'-$\Delta$ as then we would have a MMD having power<P and being able in particular to divide by $2^n$ which is in contradiction to our initial hypothesis.

It is in that sense that we say the presented MMD is close to power optimum.

To summarize, a Multi-Modulus Divider (MMD) circuit operating close to the theoretical lower energy limit is disclosed. An ingredient to energy efficiency is a novel method to track the state of an asynchronous counter with low overhead which, together with a low-frequency accumulator, enables seamless, cyclic MMD operation.

Compared to conventional pulse-swallowing MMDs the proposed architecture consumes less than half of the power and, even more important, a nominal 50% duty cycle is generated. A 50% MMD output duty cycle both benefits spectral purity in digital transmit applications and enables receive I/Q generation while cutting the VCO frequency by half.

To summarize, further embodiments of the present invention provide a mobile communication device (as shown in FIG. 6a) comprising an RF transmitter, an RF receiver or RF transceiver (or in General an RF circuit) and an antenna coupled to the RF transmitter, RF receiver or RF transceiver. The RF transmitter, the RF receiver or RF transceiver is configured to receive and/or transmit RF signals via the antenna. Furthermore, the RF transmitter, RF receiver and/or RF transceiver is configured to provide the RF signals and/or decode the received RF signals based on the output signal provided by the divider.

As an example, the mobile communication device may be a portable mobile communication device.

According to further embodiments the mobile communication device may be configured for a (wireless) voice and/or data communication (e.g., according to a mobile communication standard) with another mobile communication device and/or a mobile communication radio station.

A mobile communication device may be, as an example, a mobile handset, such as a mobile phone (cell phone), a smart phone, tablet PC, a broadband modem, a notebook or laptop but may also be a router or a personal computer.

Figure 7:
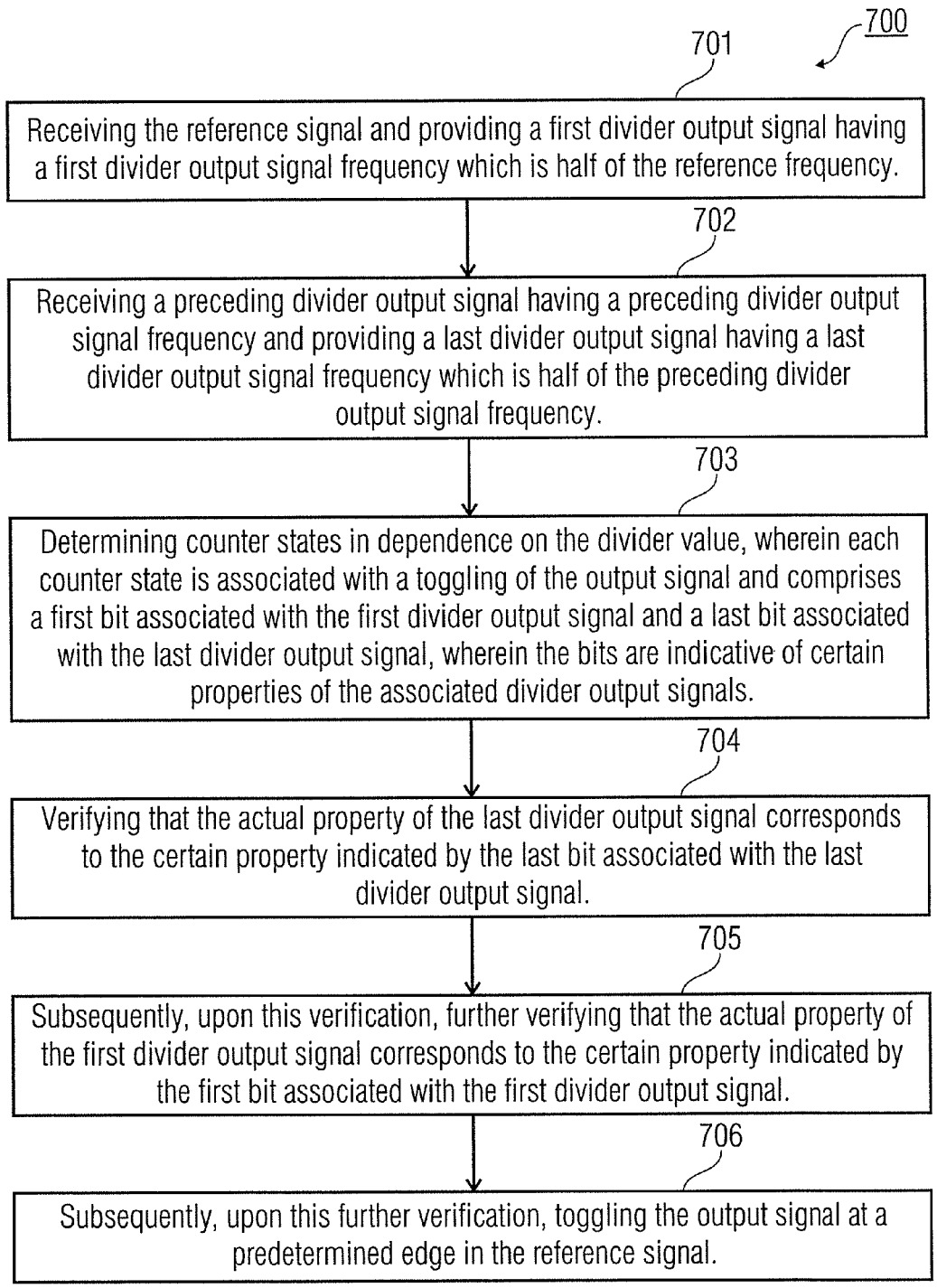
FIG. 7 shows a flow diagram of a method according to a further embodiment of the present invention.

FIG. 7 shows a flow diagram of a method 700 according to an embodiment of the present invention for providing an output signal having an output frequency by dividing a reference frequency of a reference signal by a divider value.

The method 700 comprises a step 701 of receiving the reference signal and providing a first divider output signal having a first divider output signal frequency which is half of the reference frequency.

Furthermore the method 700 comprises a step 702 of receiving a preceding divider output signal having a preceding divider output signal frequency and providing a last divider output signal having a last divider output signal frequency which is half of the preceding divider output signal frequency.

Furthermore, the method 700 comprises a step 703 of determining a toggle state based on the divider value, wherein the toggle state is associated with a toggling of the output signal and comprises a first bit associated with the first divider output signal and a last bit associated with the last divider output signal, wherein the bits are indicative of certain properties of the associated divider output signals.

Furthermore, the method 700 comprises a step 704 of verifying that an actual property of the last divider output signal corresponds to the certain property indicated by the last bit associated with the last divider output signal.

Furthermore, the method 700 comprises a step 705 of, subsequently, upon this verification (performed in step 704), further verifying that the actual property of the first divider output signal corresponds to the certain property indicated by the first bit associated with the first divider output signal.

Furthermore, the method 700 comprises a step 706 of, subsequently, upon this further verification (performed in step 705), toggling the output signal at a predetermined edge in the reference signal.

The method 700 may be performed by a divider according to an embodiment of the present invention, such as the divider 100 or the divider 300.

The method 700 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. A divider for providing an output signal having an output frequency by dividing a reference frequency of a reference signal by a divider value, the divider comprising:
   a chain of divider elements comprising at least:
      a first divider element configured to receive the reference signal and provide a first divider output signal having a first divider output signal frequency which is half of the reference frequency;
      a last divider element configured to receive a preceding divider output signal having a preceding divider output signal frequency from a preceding divider element in the chain and provide a last divider output signal having a last divider output signal frequency which is half of the preceding divider output signal frequency; and
   an output signal provider configured to provide the output signal, wherein the output signal provider is configured to:
      determine toggle states based on the divider value, wherein each toggle state is associated with a toggling of the output signal and comprises a first bit associated with the first divider output signal and a last bit associated with the last divider output signal, wherein the bits are indicative of certain properties of the associated divider output signals,
   verify that an actual property of the last divider output signal corresponds to the certain property indicated by the last bit associated with the last divider output signal, subsequently, upon this verification, further verify that the actual property of the first divider output signal corresponds to the certain property indicated by the first bit associated with the first divider output signal, and
   subsequently, upon this further verification, toggle the output signal at a predetermined edge in the reference signal.

2. The divider according to claim 1, wherein the output signal provider is configured to, in verifying that the actual property of the last divider output signal corresponds to the certain property indicated by the last bit, if the actual property of the last divider output signal does not correspond to the certain property indicated by the last bit, wait until an edge in the last divider output signal occurs such that after this edge the actual property of the last divider output signal corresponds to the certain property indicated by the last bit, before the output signal provider starts the further verification.

3. The divider according to claim 1, wherein the certain property indicated by the last bit is a state in the last divider output signal.

4. The divider according to claim 1, wherein the certain property indicated by the first bit is a predefined type of edge in the first divider output signal.

5. The divider according to claim 4, wherein a first value of the first bit corresponds to a first type of edge out of falling edge and rising edge, and a second value of the first bit corresponds to a second type of edge out of falling edge and rising edge, and wherein the first type of edge and the second type of edge are different.

6. The divider according to claim 1,
   wherein the output signal provider is configured to determine a next toggle state for which the output signal is to be toggled the next time by adding a predetermined value which is dependent on the divider value to a last toggle state for which the output signal was toggled the last time; and
   wherein the output signal provider is configured to perform the addition modulo $2^N$, wherein N is the number of divider elements in the chain.

7. The divider according to claim 1, wherein the output signal provider is configured to, for an even divider value, determine a next toggle state for which the output signal is to be toggled the next time, by adding half of the divider value to a last toggle state for which the output signal was toggled the last time.

8. The divider according to claim 1, wherein the output signal provider is configured to, for an odd divider value, determine a next toggle state for which the output signal is to be toggled the next time by alternately:
   adding the divider value integer divided by 2 to a last toggle state for which the output signal was toggled the last time; and
   adding the divider value integer divided by 2 and increased by 1 to the last toggle state for which the output signal was toggled the last time.

9. The divider according to claim 8,
   wherein the output signal provider is configured to, for the odd divider value, in the case the next toggle state is determined by adding the divider value integer divided by 2 and increased by 1 to the last toggle state, toggle the output signal at an edge from a first type of edge out of rising edge and falling edge in the reference signal occurring after the further verification has been successfully performed and, in the case the next toggle state is determined by adding the divider value integer divided by 2 to the last toggle state, toggle the output signal at an edge from a second type of edge out of rising edge and falling edge in the reference signal, which succeeds at least a further edge from the first type of edge in the reference signal, the further edge occurring after the further verification has been successfully performed; and
   wherein the first type of edge is different to the second type of edge.

10. The divider according to claim 1, wherein the output signal provider is configured to, for an even divider value, toggle the output signal always at the same type of edge out of falling edge and rising edge in the reference signal.

11. The divider according to claim 1, wherein the output signal provider is configured to, for an odd divider value, alternately toggle the output signal at a rising edge in the reference signal and a falling edge in the reference signal.

12. The divider according to claim 1, wherein the output signal provider comprises an adder configured to determine the toggle states based on the divider value.

13. The divider according to claim 12, wherein the adder is configured to determine for each toggling of the output signal a new toggle state.

14. The divider according to claim 12,
wherein the adder is configured to receive a clock signal and wherein the adder is configured to, in response to a predefined edge in the clock signal, determine a next toggle state which is associated with an upcoming toggling of the output signal; and
wherein the clock signal is based on the first divider output signal.

15. The divider according to claim 12, wherein the adder is configured to continuously, without resetting toggle states, determine the toggle states.

16. The divider according to claim 1, further comprising a plurality of divider elements arranged between the first divider element and the last divider element in the chain such that a given divider output signal frequency of a given divider output signal of a given divider element in the chain is half of another given divider output signal frequency of another given divider output signal of another given divider element in the chain preceding the given divider element in the chain.

17. The divider according to claim 16, wherein the output signal provider is configured to determine the toggle states such that each toggle state comprises for each divider output signal an associated bit indicative of the certain property of the associated divider output signal.

18. The divider according to claim 16,
wherein the output signal provider is configured to, for each toggle state starting with the last divider element subsequently verify that an actual property of each divider output signal of each divider element corresponds to the certain property indicated by the associated bit in the toggle state; and
wherein after all verifications have been completed, toggle the output signal at the predetermined edge in the reference signal.

19. The divider according to claim 1,
wherein the output signal provider comprises, per divider element in the chain, a signal tracker associated with the divider element;
wherein each signal tracker is configured to verify for each toggle state that the actual property of the divider output signal of its associated divider element corresponds to the associated bit in the toggle state;
wherein the output signal provider is configured to activate a given signal tracker associated with a given divider element only after a verification has been performed by another given signal tracker associated to another given divider element, which directly succeeds the given divider element in the chain.

20. The divider according to claim 19, wherein the output signal provider is configured to reset the signal trackers after a verification has been performed by a first signal tracker associated with the first divider element.

21. The divider according to claim 19, wherein a last signal tracker associated with the last divider element is configured to, in verifying that the actual property of the last divider output signal corresponds to the certain property indicated by the last bit of the toggle state, perform an XOR combination of the last divider output signal and the last bit of the toggle state.

22. The divider according to claim 1, wherein all divider elements in the chain are divide by 2 elements.

23. The divider according to claim 1, wherein the output signal provider is configured to provide the output signal such that for even divider values and for odd divider values a duty cycle of the output signal is 50%.

24. A divider for providing an output signal having an output frequency by dividing a reference frequency of a reference signal by a divider value, the divider comprising:
a chain of divide by 2 elements comprising:
a first divide by 2 element configured to receive the reference signal and provide a first divider output signal having a first divider output signal frequency which is half of the reference frequency;
a last divide by 2 element configured to receive a preceding divider output signal having a preceding divider output signal frequency from a preceding divide by 2 element in the chain and provide a last divider output signal having a last divider output signal frequency which is half of the preceding divider output signal frequency; and
a plurality of further divide by 2 elements which are arranged between the first divide by 2 element and the last divide by 2 element in the chain such that a given divider output signal frequency of a given divider output signal of a given divide by 2 element in the chain is half of another given divider output signal frequency of another given divider output signal of another given divide by 2 element in the chain preceding the given divide by 2 element in the chain;
an output signal provider configured to provide the output signal such that for even divider values and for odd divider values a duty cycle of the output signal is 50%, wherein the output signal provider is further configured to:
continuously, without resetting toggle states, determine toggle states based on the divider value, wherein each toggle state is associated with a toggling of the output signal and comprises for each divider output signal an associated bit indicative of a certain property of the associated divider output signal, wherein the certain property indicated by a last bit of a toggle state is a state in the last divider output signal and the certain properties indicated by all other bits of the toggle state are predefined types of edges in the associated divider output signals;
subsequently verify for each toggle state starting with the last divide by 2 element that an actual property of each divider output signal of each divide by 2 element corresponds to the certain property indicated by the associated bit in the toggle state; and
after all verifications have been completed, toggle the output signal at a predetermined edge in the reference signal, such that for even divider values, the output signal is toggled always at the same type of edges out of falling edge and rising edge in the reference signal and for odd divider values the output signal is alternately toggled at a rising edge in the reference signal and a falling edge in the reference signal.

25. A method for providing an output signal having an output frequency by dividing a reference frequency of a reference signal by a divider value, the method comprising:
receiving the reference signal and providing a first divider output signal having a first divider output signal frequency which is half of the reference frequency;
receiving a preceding divider output signal having a preceding divider output signal frequency and providing a last divider output signal having a last divider output signal frequency which is half of the preceding divider output signal frequency;

determining toggle states based on the divider value, wherein each toggle state is associated with a toggling of the output signal and comprises a first bit associated with the first divider output signal and a last bit associated with the last divider output signal, wherein the bits are indicative of certain properties of the associated divider output signals;

verifying that an actual property of the last divider output signal corresponds to the certain property indicated by the last bit associated with the last divider output signal;

subsequently, upon the verification, further verifying that the actual property of the first divider output signal corresponds to the certain property indicated by the first bit associated with the first divider output signal; and subsequently, upon the further verification, toggling the output signal at a predetermined edge in the reference signal.

26. A non-transitory storage medium having stored thereon a computer program having a program code for performing, when running on a computer, a method for providing an output signal having an output frequency by dividing a reference frequency of a reference signal by a divider value, the method comprising:

receiving the reference signal and providing a first divider output signal having a first divider output signal frequency which is half of the reference frequency;

receiving a preceding divider output signal having a preceding divider output signal frequency and providing a last divider output signal having a last divider output signal frequency which is half of the preceding divider output signal frequency;

determining toggle states based on the divider value, wherein each toggle state is associated with a toggling of the output signal and comprises a first bit associated with the first divider output signal and a last bit associated with the last divider output signal, wherein the bits are indicative of certain properties of the associated divider output signals;

verifying that an actual property of the last divider output signal corresponds to the certain property indicated by the last bit associated with the last divider output signal;

subsequently, upon the verification, further verifying that the actual property of the first divider output signal corresponds to the certain property indicated by the first bit associated with the first divider output signal; and subsequently, upon the further verification, toggling the output signal at a predetermined edge in the reference signal.

27. A mobile communication device comprising an RF circuit configured to provide or receive RF signals, wherein the RF circuit comprises a divider for providing an output signal having an output frequency by dividing a reference frequency of a reference signal by a divider value, the divider comprising:

a chain of divider elements comprising at least:

a first divider element configured to receive the reference signal and provide a first divider output signal having a first divider output signal frequency which is half of the reference frequency;

a last divider element configured to receive a preceding divider output signal having a preceding divider output signal frequency from a preceding divider element in the chain and provide a last divider output signal having a last divider output signal frequency which is half of the preceding divider output signal frequency; and an output signal provider for providing the output signal, wherein the output signal provider is configured to:

determine toggle states based on the divider value, wherein each toggle state is associated with a toggling of the output signal and comprises a first bit associated with the first divider output signal and a last bit associated with the last divider output signal, wherein the bits are indicative of certain properties of the associated divider output signals, verify that an actual property of the last divider output signal corresponds to the certain property indicated by the last bit associated with the last divider output signal, subsequently, upon the verification, further verify that the actual property of the first divider output signal corresponds to the certain property indicated by the first bit associated with the first divider output signal, and subsequently, upon the further verification, toggle the output signal at a predetermined edge in the reference signal; and wherein the RF circuit is configured to provide the RF signals or to decode the received RF signals based on the output signal provided by the divider.

* * * * *